United States Patent [19]

Knauer

[11] 4,242,654
[45] Dec. 30, 1980

[54] CTD TRANSVERSAL FILTER WITH PARALLEL INPUTS

[75] Inventor: Karl Knauer, Kirchseeon, Fed. Rep. of Germany

[73] Assignee: Siemens Aktiengesellschaft, Berlin & Munich, Fed. Rep. of Germany

[21] Appl. No.: 73,726

[22] Filed: Sep. 10, 1979

[30] Foreign Application Priority Data

Sep. 29, 1978 [DE] Fed. Rep. of Germany ....... 2842630

[51] Int. Cl.³ .................... H03H 15/02; H03H 17/06; H03H 17/284; G11C 19/28
[52] U.S. Cl. ............................... 333/165; 307/221 D; 333/166; 357/24
[58] Field of Search ................ 333/165, 166, 173-174; 307/221 R, 221 C, 221 D, 295, 304; 357/24; 364/824-827, 862

[56] References Cited

U.S. PATENT DOCUMENTS

| | | | |
|---|---|---|---|
| 4,035,628 | 7/1977 | Lampe et al. | 333/165 X |
| 4,080,581 | 3/1978 | Sakaue et al. | 333/165 |
| 4,163,957 | 8/1979 | Knauer et al. | 333/165 |
| 4,188,597 | 2/1980 | Knauer | 307/221 DX |

OTHER PUBLICATIONS

Knauer et al.-"CCD Transversal Filters with Parallel-In/Serial-Out Configuration", Siemans Research and Development Report, vol. 7, 1978, No. 3, pp. 138-142.

*Primary Examiner*—Marvin L. Nussbaum
*Attorney, Agent, or Firm*—Hill, Van Santen, Steadman, Chiara & Simpson

[57] ABSTRACT

A CTD transversal filter is disclosed which comprises a CTD arrangement with parallel inputs and evaluation circuits. The evaluation coefficients are set up in digital fashion by means of comparator-controlled input sequences of signal-dependent quantities of charge. High value coefficients may be established without the need to reduce a lower frequency transmission limit. With the invention, the transfer electrodes of the CTD are not supplied with the normal clock voltages but with the output voltages of a shift register in which circulates an item of logic information which forwards the input charges individually and consecutively by one electrode spacing. The application of this "electrode-per-bit" operation results in a considerable increase in the times for the individual input sequences. The invention is useful in programmable frequency filters.

8 Claims, 2 Drawing Figures

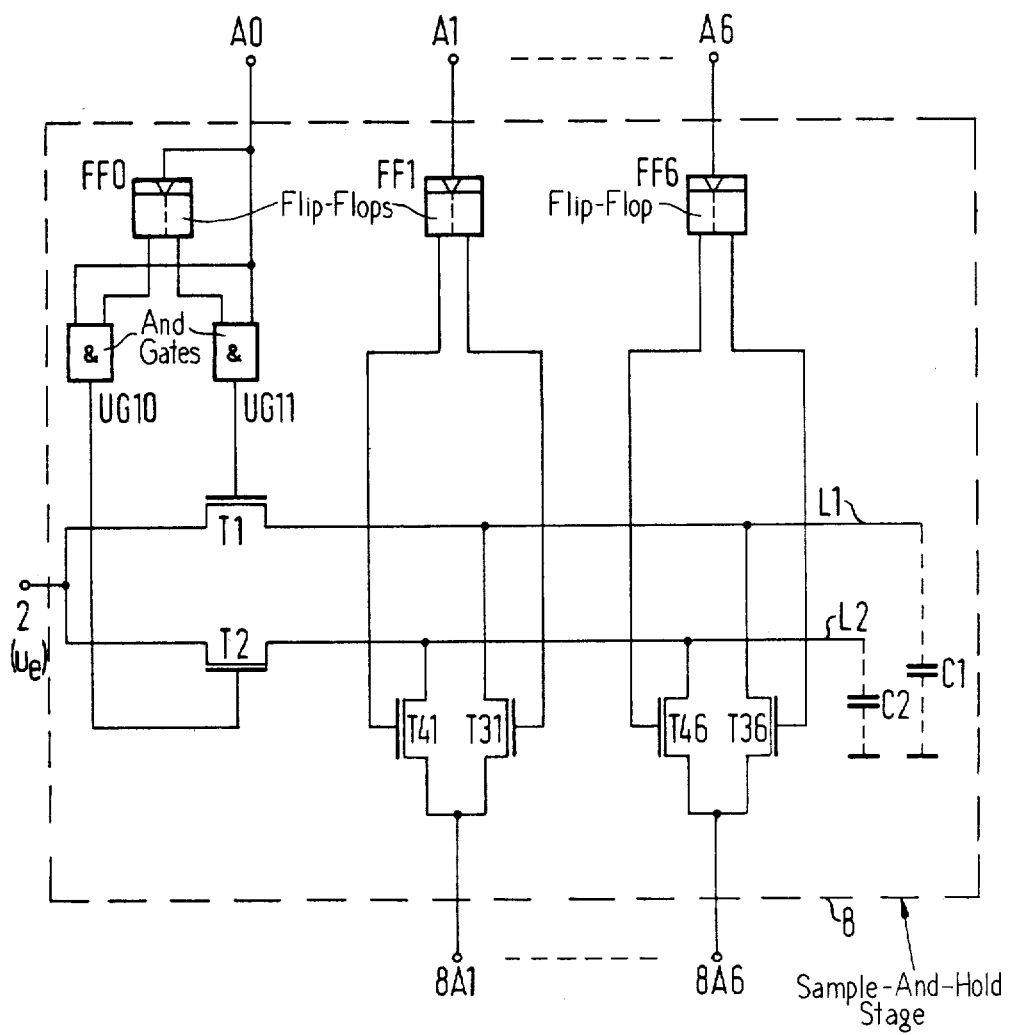

4,242,654

CTD TRANSVERSAL FILTER WITH PARALLEL INPUTS

BACKGROUND OF THE INVENTION

The invention relates to a CTD transversal filter with parallel inputs and evaluation circuits. The CTD arrangement comprises an output stage at which a filtered output signal can be tapped. Comparators are provided whose inputs are connected to counters supplied with clock pulses and connected to digital stores.

A transversal filter of this kind has already been proposed in the U.S. patent application Ser. No. 017,242 filed Mar. 5, 1979 (incorporated herein by reference) in which the digital signals input into the stores each determine the length of the opening times of the gate circuits which are individually assigned to the individual evaluation circuits. As the input of specific signal-dependent quantities of charge into the stages of the CTD arrangement is carried out according to the timing of the clock voltages supplied to the evaluation circuits, the opening time represents a gauge of the total quantity of signal-dependent charge which is input into a stage. Thus the opening time also determines the value of the evaluation coefficient assigned to an evaluation circuit. In the proposed transversal filter the stages of the CTD arrangement each comprise two or more electrodes beneath which the signal-dependent quantities of charge, having been input, are transported on in stepped fashion in the direction of the output stage of the CTD arrangement by means of clock voltages which are fed to the electrodes. However, at a specific frequency of these clock voltages for which the transmission of a given lowest signal frequency may not fall below, the aforementioned opening times are not always sufficient to achieve high evaluation coefficients with which a correspondingly large number of signal-dependent charges must be consecutively input into a stage.

This problem does not occur in other CTD transversal filters with parallel inputs which are disclosed for example in the Siemens Forschungs- und Entwichlungsberichten, Vol. 7 (1978) No. 3, pages 138 to 142, as in these the values of the evaluation coefficients is determined not by a corresponding number of periodic inputs of relatively small, constant quantities of charge, but by one single input of a quantity of charge whose size is determined by the area of one of the input gate electrodes contained in the evaluation circuit. However, with this method of coefficient formation, high coefficient values also necessitate a corresponding semiconductor area.

SUMMARY OF THE INVENTION

An object of the invention is to provide a CTD transversal filter as described above in which even high evaluation coefficients can be achieved without the need to reduce the lowest signal frequency transmitted by the filter.

According to the CTD arrangement of this invention, the stages of the CTD arrangement comprise transfer electrodes connected to the outputs of stages of a shift register. The shift register is designed such that an individual item of logic information circulates therein in dependence upon further clock pulses. The output of the stage which in each case contains this item of logic information has a first output voltage which results in a transfer of charge between the transfer electrode with which it is supplied and an adjacent transfer electrode. The other register outputs each possess output voltages which result in the storage of charge between those transfer electrodes to which they are connected and which are not participating in the aforementioned charge transfer.

The advantage which can be achieved by means of the invention is that considerably higher evaluation coefficients can be achieved in the evaluation circuits arranged at the parallel inputs without the need to provide correspondingly low clock frequencies for the CTD arrangement. At the same time the digital adjustability of the evaluation coefficients permits a higher accuracy in the setting of a desired filter function.

BRIEF DESCRIPTION OF THE DRAWINGS

FIG. 2 illustrates an advantageous development of a sub-circuit of FIG. 1.

DESCRIPTION OF THE PREFERRED EMBODIMENTS

Figure 1:
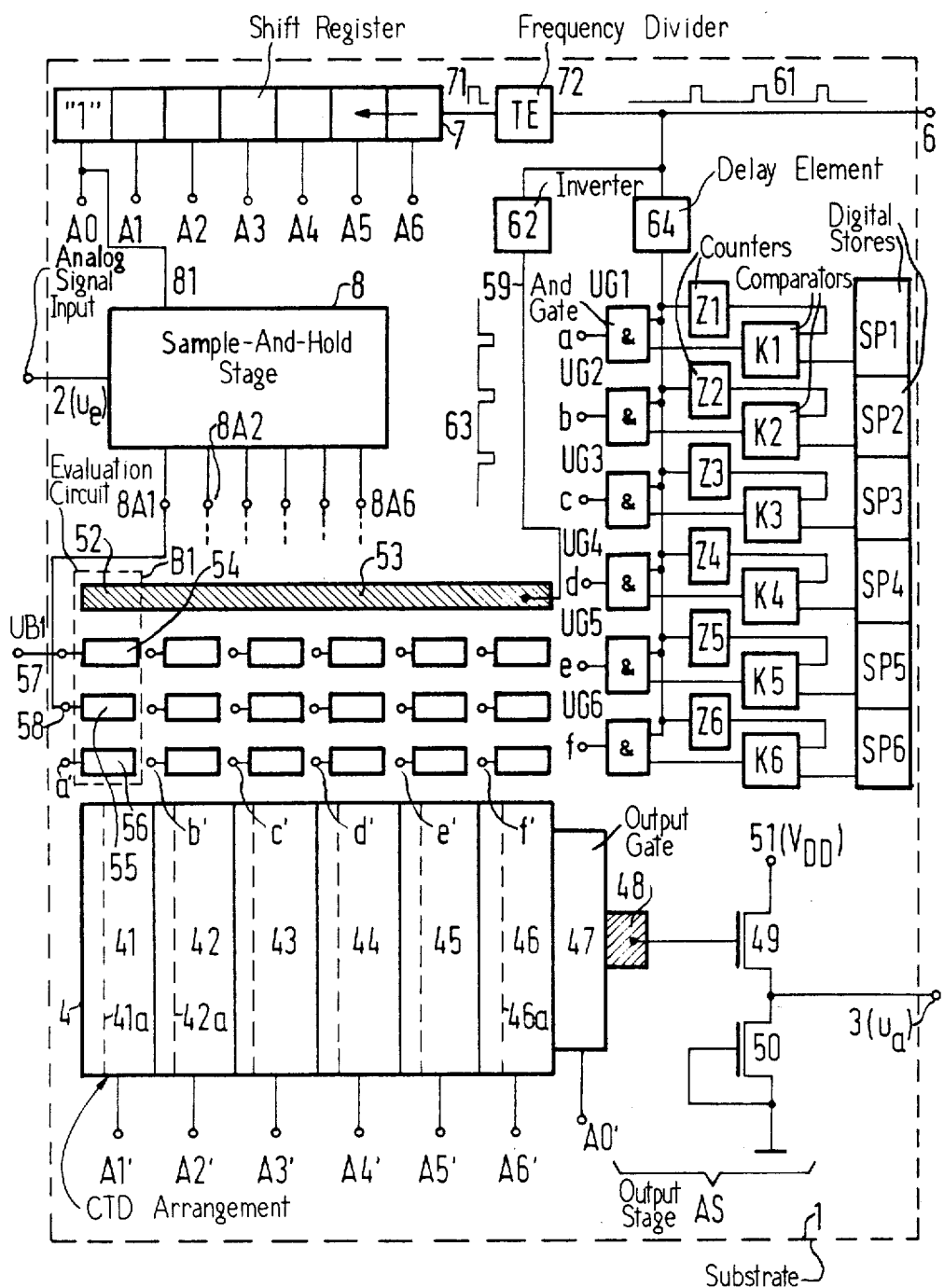
FIG. 1 illustrates the circuit system construction of a CTD transversal filter corresponding to the invention.

The transveral filter schematically illustrated in FIG. 1 is designed as a semiconductor circuit monolithically integrated on a doped semiconductor substrate 1 consisting for example of p-conducting silicon. A circuit input 2 is supplied with an analogue input signal $u_e$ whereas at the output 3 there can be tapped an analogue output signal $u_a$ whose time curve corresponds to that of the signal $u_e$ since the latter has passed through a frequency filter having specific frequency characteristics. The frequency characteristics can, for example, be those of a low-pass filter. Reference numeral 4 designates a CTD arrangement which comprises a series of closely adjacent transfer electrodes 41 to 46 which are separated from the substrate 1 by a thin insulating layer, consisting, for example of $SiO_2$. These electrodes can consist, for example, of aluminum or of highly doped polycrystalline silicon. Reference numeral 47 designates an output gate which is followed by an output stage AS. The latter comprises a semiconductor zone 48 which is doped oppositely to the substrate 1, and a field effect transistor 49 which is connected by its gate terminal to the zone 48. The source-drain path of the transistor 49 is connected in series to the source-drain path of a further field effect transistor 50. This series arrangement is connected on the one hand to a terminal 51 which supplies the supply voltage $V_{DD}$ and on the other hand to a reference potential. The gate of the transistor 50 is connected to its source terminal so that it serves as a load element. The output 3 of the overall filter circuit is connected between the drain terminal of transistor 50 and the source terminal of transistor 49.

The transfer or shift electrodes 41 to 46 and the output gate 47 are provided with terminals A1', A2' ... A0'. Each of the transfer electrodes 41 to 46 represents an individual stage of the CTD arrangement 4 and is provided with an evaluation circuit arranged above in FIG. 1. If, for example, one considers the stage with the electrode 41, then the assigned evaluation circuit B1 has a semiconductor zone 52 which is doped oppositely to the substrate 1 and which is formed from a portion of a strip-like zone 53. The stage with the electrode 41 further has input electrodes 54 and 55 arranged in insulated fashion above the substrate 1, and a transfer gate 56 which is likewise insulated from the substrate 1 and has a terminal a'. The terminals of the input gate electrodes 54 and 55 are referenced 57 and 58.

The evaluation circuits which are assigned to the other stages are constructed accordingly, and their transfer gate electrodes are provided with terminals b', c' . . f'. The strip-like zone 53 is connected via a supply line 59 to a terminal 6 across which a clock voltage 61 is supplied. An inverter 62 ensures that the positive clock pulses of the clock voltage 61 are inverted into negative clock pulses of a clock voltage 63 which are then fed to the zone 53. The clock voltage 61 is fed via a delay element 64 to the inputs of counters Z1 to Z6 which count the clock pulses of the voltage 61. The counts in each case output at the counter outputs by means of digital counter signals are fed to the first inputs of comparators K1 to K6 individually assigned to the individual evaluation circuits. The second inputs of these comparators are connected to digital stores SP1 to SP6 into which are fed digital signals which determine the values of the evaluation coefficients which prevail during input beneath the electrodes 41 to 46. For this purpose the outputs of the comparators K1 to K6 are connected to the first inputs of AND-gates UG1 to UG6 whose second inputs are connected to the output of the delay element 64. The outputs, referenced a to f, of the AND-gates UG1 to UG6 lead to the terminals a' to f' of the transfer gate electrodes of the individual evaluation circuits.

Reference numeral 7 designates a shift register whose individual stages are provided with the outputs A0, A1 . . . A6. In this shift register one single logic "1" circulates in the direction of the arrow, whereas those stages which do not display a "1" display a "0". The circulation is controlled by clock pulses 71 which are derived from the clock pulses of the clock voltage 61 by means of a frequency divider 72. When, during its circulation, the "1" reaches the stage provided with the output A0, with the next incoming clock pulse 71 it passes into the stage provided with the output A6. The outputs A0 to A6 of the shift register 7 are connected to the terminals of the electrodes A0' to A6'.

FIG. 1 contains a sample-and-hold stage 8 whose input is connected to the circuit input 2 and whose first output 8A1 is connected to the terminal 58 of the second input gate 55 of the first evaluation circuit B1. The first input gate 54 of this evaluation circuit is connected via a terminal 57 to a constant D.C. voltage $U_{B1}$ which may not exceed the minimum amplitude value which is derived from the input signal $u_e$ via the stage 8 and its output 8A1. This connection of the input electrodes 54 and 55 sets up the evaluation circuit B1 for a positive sign of the evaluation coefficient. If it were to be set up for a negative sign, the output 8A1 would have to be connected to the terminal 57 of the first input gate 54, whereas the terminal 58 would have to be connected to a second constant D.C. voltage $U_{B2}$ which would at least have to equal the maximum amplitude value which is derived from the input signal $u_e$ via the output 8A1.

When the evaluation circuit (B1 in FIG. 1) is set up for a positive evaluation coefficient, on the occurrence of a negative clock pulse 63 charge carriers are conveyed out of zone 52 into the semiconductor zone beneath the input gate electrodes 54 and 55, and on the conclusion of this clock pulse are transported back into the zone 52 except for a signal-dependent charge which has accumulated beneath the gate 55, which method is also known as "fill and spill". On the occurrence of a clock pulse which has been delayed in 64 and fed via UG1 a and a' to the transfer gate 56 of B1, the signal-dependent charge is input beneath the transfer electrode 41. With an increasing signal amplitude the input quantity of charge is itself increased.

In the case of an evaluation circuit set up for a negative evaluation coefficient, a signal-dependent charge which is inversely proportional to the increase in the signal amplitude accumulates beneath the second input gate.

Details of charge input involving evaluation coefficients are given in the Siemens Forschungs- und Entwicklungsberichten Vol. 7, (1978) No. 3, pages 138 to 142, published by Springer Berlin 1978. The principle of charge input is explained in particular with reference to FIG. 3 and the associated text on page 139, whereas FIG. 2 including the associated text deals with the construction of evaluation circuits, set out before positive and negative signs, at the parallel inputs of CTD transversal filters.

The other outputs 8A2 to 8A6 in stage 8 are connected in similar fashion to the evaluation circuits beside the electrodes 42 to 46, i.e. in the case of a positive evaluation coefficient are connected to the second input gate electrodes, whereas in the case of a negative evaluation coefficient they are connected to the first input gate electrodes.

The operation will be assumed to commence from a state in which the "1" occupies the illustrated position in the shift register 7. The output gate 47 is connected via the interconnected terminals A0 to A0' to a first output voltage of the shift register 7, the value of which voltage is such that charges stored beneath the transfer electrode 46 are transferred into the zone 48 of the output stage AS. As the zone 48 has been previously temporarily reset via a switch to a reference potential, the penetrating charge results in a change in potential which is forwarded via the source-follower stage 49, 50 in the form of a voltage signal $u_a$ to the output 3. At the same time the sample-and-hold stage 8 is caused by the line 81 connected to the output $A_o$ of 7 to sample and store the instantaneous value of $u_e$ present at the input 2. This sample value is then switched through to the outputs 8A1 to 8A6. The "1" in the shift register 7 is stepped on to the stage provided with the output A6. As a result only the charge contained under 45 is transferred beneath the electrode 46, whereas all the other charges which have already been input remain stored. Via the output A6, the counter Z6 is reset to a count of 0. The incoming clock pulses of the clock voltage 61 then produce a constant change in the count of Z6, and the counter signal is constantly digitally compared with the digital signal stored in SP6. For such time as the count remains smaller than the number stored in SP6, K1 emits a signal which opens the gate UG1. The clock pulses of the clock voltage 61 now pass via f and f' to the transfer gate and on each occasion result in the input of the signal-dependent charge previously stored beneath the second input gate. These input processes continue in the timing of the aforementioned clock pulses until the comparator K6 establishes that the count has exceeded the number stored in SP6 and emits a signal which blocks UG6. The input sequence beneath the electrode 46 is thus concluded. Input sequences which take place beneath the electrodes 41 to 44 simultaneously to this input sequence are carried out correspondingly in individual dependence upon the numbers stored in SP1 to SP4.

When the "1" in the shift register 7 is stepped into the stage provided with the output 15, which can even occur before the end of the input sequence beneath the electrode 46, only the charge previously contained beneath 44 is transferred beneath the electrode 45, whereas all the other charges remain stored. At the same time the counter Z5 is reset to zero via the output A5 so that it commences to count the incoming clock pulses of the clock voltage 61. This commences an input sequence beneath the electrode 45 which increases the charge previously present beneath 44. The input sequences beneath 41 to 43 and 46 are continued.

On the next occasions when the "1" in the shift register 7 is stepped on, the charges from the semiconductor zones are consecutively transferred beneath 43 and 44, 42 and 43, and 41 and 42. Since, with the exception of one single charge which is currently being transferred, all the other previously input charges remain stationary. The input sequences can continue undisturbed at the location of the stationary charges.

Whenever a charge is forwarded beneath a new electrode, an input sequence commences for the CTD stage containing this new electrode, whereas the input sequence at the directly preceding stage must be concluded and the input sequences for the other stages can continue undisturbed provided they have not already been concluded by the blockage of the assigned AND-gates.

This produces, quite generally, input sequences whose duration corresponds approximately to one circulation of the "1" in the shift register 7 which has been reduced by one stage. If the clock pulses possess a repetition rate of f, a signal frequency of f/n occurs at the output 3 when n is the number of the CTD stages. Thus each evaluation circuit has available a time of approximately n/f to conclude an input sequence which can also be employed in the case of normal lower limit values of the frequency range to be transmitted for the input of high evaluation coefficients.

In order to clearly establish the direction of the charge transportation in the CTD arrangement, the transfer electrodes 41 to 46 are expediently divided into two parts by the broken lines 41a, 42a, ... 46a. That part which is further removed from the output stage AS can be arranged on an insulating layer of greater thickness than the part which is closer to AS, or else a higher degree of doping of the semiconductor substrate can be provided beneath the further removed part than beneath the other part.

FIG. 2 illustrates a preferred embodiment of the sample-and-hold stage 8 in FIG. 1. Here the circuit input 2 is connected via the source-drain paths of a first and second switching transistor T1 and T2 to a capacitor C1, C2 respectively which can also be formed by the divided capacitances of two lines L1, L2. One electrode of the first capacitor C1 is connected via a series of third switching transistors T31 through T36 to the outputs 8A1 to 8A6, whereas one electrode of the second capacitor C2 is connected via a row of fourth switching transistors T41 to T46 to the same outputs 8A1 to 8A6. A third switching transistor, e.g. T31, and the fourth switching transistor, e.g. T41 which is connected with the latter to the same output, are connected by their gate terminals to the outputs of a flip-flop which are inverted with respect to one another, e.g. FF1. The clock input of the relevant flip-flop is then connected to an output of the shift register 7 whose ordinal number corresponds to that of the output of the sample-and-hold stage 8. A flip-flop FF0 is also provided whose clock input is connected to the output A0 of the shift register 7. The outputs of FF0 which are inverted to one another are connected to the second inputs of two AND-gates UG10 and UG11 whose first inputs are likewise connected to the output A0. The outputs of the AND-gates UG10 and UG11 are connected to the gate terminals of the first and second switching transistors T1 and T2 respectively.

This design of the sample-and-hold stage 8 ensures that whenever a previously input charge is forwarded beneath a transfer electrode, the third and fourth switching transistors which were each previously conductive are replaced by the fourth and third switching transistors, respectively. As whenever A0 emits a higher voltage value one of the two switching transistors T1 or T2 temporarily goes conductive in alternating sequence, the two lines L1, L2 and the two capacitors C1, C2 are charged in alternating sequence to an equidistant sequence of instantaneous values of the input signal $u_e$. The aforementioned substitution of the third switching transistor by the fourth switching transistor and vice versa signifies a change from the instantaneous value which is stored for a longer length of time to the instantaneous value which is stored for a shorter length of time. Thus each commencing input sequence is based upon the input signal amplitude value which is stored for a shorter length of time.

In the above described exemplary embodiment, a relatively small number of six transfer electrodes 41 to 46 has been provided in order to simplify the drawing. In many cases the number of transfer electrodes will be larger, in which case the number of stages of the shift register 7 and the number of counters assigned to the transfer electrodes, and the number of comparators, stores and AND-gates will increase accordingly. For most applications a number of transfer electrodes of between 3 and 50 will be adequate.

Although various minor modifications may be suggested by those versed in the art, it should be understood that I wish to embody within the scope of the patent warranted hereon, all such embodiments as reasonably and properly come within the scope of my contribution to the art.

I claim as my invention:

1. A charge transfer device (CTD) transversal filter, comprising: a CTD arrangement having stages constructed on a doped semiconductor substrate, the CTD having parallel inputs and evaluation circuits; the evaluation circuits each including a zone doped oppositely to the substrate, a first and second input gate, and a transfer gate; one of said first and second input gates being supplied with an input signal, the other of said first and second input gates being supplied with a constant D.C. voltage, the oppositely doped zone being supplied with a first clock voltage, and the transfer gate being supplied with a second clock voltage; the CTD arrangement also having an output stage at which a filtered output signal is tapped; comparators whose first inputs are connected to counter signals generated by counters supplied with a third clock voltage, whose second inputs are connected to digital signals generated by digital stores, and outputs of the comparators being connected to gate circuit means for blocking the evaluation circuits with respect to one of the supplied clock voltages in dependence upon a comparison between said counter signals and said digital signals; each of the stages of the CTD arrangement having its transfer electrode connected to a respective output of a respective stage of a shift register means for circulating an individual item of logic information therein in dependence upon a fourth clock voltage; and the shift register means creating at the output of the shift register stage containing this item of logic information, a first output voltage for transferring charge between the transfer electrode with which it is connected and an adjacent transfer electrode, the shift register means providing output voltages through the other shift register stage outputs for the storage of charge beneath those transfer electrodes to which they are connected which are not participating in said transfer of charge.

2. A transversal filter of claim 1 wherein a circuit input having an analog input signal is connected via a sample-and-hold stage to said one of the input gates in each evaluation circuit having the input signal supplied thereto.

3. A transversal filter of claim 1 wherein between a last stage of the CTD arrangement and said output stage there is arranged an output gate which is connected to an output of a further stage of said shift register means.

4. A transversal filter of claim 2 wherein a control input of the sample-and-hold stage is connected to an output of a stage of said shift register means.

5. A transversal filter of claim 1 wherein the transfer electrodes of the CTD arrangement are divided into two parts arranged in series in a direction of charge transfer and are separated from the semiconductor substrate by insulating layers of differing thickness.

6. A transversal filter of claim 1 wherein substrate zones located beneath the transfer electrodes are each split into two sub-zones which are arranged in series in a direction of charge transfer, a first of the sub-zones being more strongly doped than a second one thereof.

7. A transversal filter of claim 2 wherein an input of the sample-and-hold stage is connected via a first and a second switching transistor to first and second capacitances, respectively; one electrode of the first capacitance being connected via a plurality of third switching transistors to said one input gates of each of the evaluation circuits respectively; one electrode of the second capacitance being connected via a plurality of fourth switching transistors to said one input gate of the each of the respective evaluation circuits; the third switching transistor and the fourth switching transistor connected to the same evaluation circuit input gate being connected by their gate terminals to respective inverse outputs of a first flip-flop, a clock input of each of the flip-flops being connected to the respective outputs of the stages of the shift register means; the output of one of the stages of the shift register means being connected to first inputs of two AND-gates whose second inputs are connected to inverse outputs of a second flip-flop, a clock input of the second flip-flop being connected to the output of said one stage of the shift register means, and outputs of the two AND-gates being connected to gate terminals of the first and second switching transistors.

8. A transversal filter of claim 1 wherein the filter is a semiconductor circuit monolithically integrated on the semiconductor substrate.

* * * * *